(12) United States Patent
Stanje et al.

(10) Patent No.: US 12,390,833 B2
(45) Date of Patent: Aug. 19, 2025

(54) APPARATUS FOR GENERATING A HAPTIC SIGNAL

(71) Applicant: TDK Electronics AG, Munich (DE)

(72) Inventors: Bernhard Stanje, Graz (AT); Andreas Pentscher-Stani, Leibnitz (AT); Johannes Burger, Deutschlandsberg (AT)

(73) Assignee: TDK Electronics AG, Munich (DE)

( * ) Notice: Subject to any disclaimer, the term of this patent is extended or adjusted under 35 U.S.C. 154(b) by 834 days.

(21) Appl. No.: 17/641,756

(22) PCT Filed: Jun. 17, 2021

(86) PCT No.: PCT/EP2021/066425
§ 371 (c)(1),
(2) Date: Mar. 9, 2022

(87) PCT Pub. No.: WO2022/012847
PCT Pub. Date: Jan. 20, 2022

(65) Prior Publication Data
US 2022/0297159 A1  Sep. 22, 2022

(30) Foreign Application Priority Data

Jul. 14, 2020  (DE) .......................... 102020118568.5

(51) Int. Cl.
*B06B 1/06* (2006.01)
*G06F 3/01* (2006.01)
(Continued)

(52) U.S. Cl.
CPC ............ *B06B 1/0662* (2013.01); *G06F 3/016* (2013.01); *H10N 30/101* (2024.05); *H10N 30/20* (2023.02); *H10N 30/50* (2023.02); *H10N 30/886* (2023.02)

(58) Field of Classification Search
CPC .... B06B 1/0662; H10N 30/50; H10N 30/886; H10N 30/20
(Continued)

(56) References Cited

U.S. PATENT DOCUMENTS 7,446,456 B2 * 11/2008 Maruyama .............. G06F 3/011
310/317
10,345,910 B1  7/2019 Khoshkava
(Continued)

FOREIGN PATENT DOCUMENTS

DE  102016122610 A1  5/2018
EP  2060968 A1  5/2009
(Continued)

OTHER PUBLICATIONS

International Search Report and Written Opinion of International Searching Authority corresponding to International Patent Application No. PCT/EP2021/066425, with English translation of the Search Report, mailed Sep. 16, 2021 (13 pages).

*Primary Examiner* — Derek J Rosenau
(74) *Attorney, Agent, or Firm* — Nixon Peabody LLP

(57) ABSTRACT

A device for generating a haptic signal. The device includes a haptic module for generating a vibration, a base plate and a cover plate arranged parallel to each other. The cover plate has an abutment surface facing towards the base plate and a top side facing away from the base plate. The haptic module is arranged between the base cover plates, a first partial area of the haptic module abuts the abutment surface of the cover plate and a second partial area of the haptic module abuts the base plate. A spring-loaded suspension mechanically connects the base plate and the cover plate. The spring-loaded suspension is designed so that the abutment surface of the cover plate is moved towards the base plate when the cover plate is in a neutral position and a force is exerted in the
(Continued)

direction of the base plate on any point on the top side of the cover plate.

21 Claims, 4 Drawing Sheets

(51) Int. Cl.
  *H01L 41/053* (2006.01)
  *H10N 30/00* (2023.01)
  *H10N 30/20* (2023.01)
  *H10N 30/50* (2023.01)
  *H10N 30/88* (2023.01)

(58) Field of Classification Search
  USPC .......................................................... 310/328
  See application file for complete search history.

(56) References Cited

U.S. PATENT DOCUMENTS

| | | |
|---|---|---|
| 10,395,489 B1 | 8/2019 | Cruz-Hernandez |
| 2019/0334077 A1 | 10/2019 | Galler |
| 2019/0385420 A1 | 12/2019 | Khoshkava |
| 2021/0031235 A1 | 2/2021 | Neuwirth |
| 2021/0141456 A1 | 5/2021 | Neuwirth |
| 2021/0365118 A1 | 11/2021 | Rajapurkar |

FOREIGN PATENT DOCUMENTS

| | | |
|---|---|---|
| EP | 3581826 A1 | 12/2019 |
| WO | WO 2015/081356 A1 | 6/2016 |
| WO | WO 2018/095900 A1 | 5/2018 |
| WO | WO 2019/020205 A1 | 1/2019 |
| WO | WO 2019/154810 A1 | 8/2019 |
| WO | WO 2019/193006 A1 | 10/2019 |

* cited by examiner

APPARATUS FOR GENERATING A HAPTIC SIGNAL

CROSS-REFERENCE TO RELATED APPLICATIONS

This application is a U.S. National Stage of International Application No. PCT/EP2021/066425, filed Jun. 17, 2021, which claims the benefit of German Patent Application No. 102020118568.5, filed Jul. 14, 2020, both of which are incorporated herein by reference in their entireties.

The invention relates to a device for generating a haptic signal. The device has a spring-loaded suspension via which a base plate and a cover plate are connected to one another, which are moved relative to one another in order to generate the haptic signal.

U.S. Pat. No. 10,345,910 B1 shows a device in which a cover and a base are connected to each other by springs. The suspension by the springs cannot prevent the cover from tilting relative to the base. For example, if a force is applied to a left edge of the cover, the left edge of the cover will move towards the base and the right edge of the cover will move away from the base.

Other devices for generating haptic signals are known from U.S. Pat. No. 10,395,489 B1 and US 2019/0385420 A1.

It is the object of the present invention to disclose an improved device for generating a haptic signal. In particular, the object is to provide a device comprising a single actuator capable of generating a haptic signal at each position of a cover plate, wherein the cover plate may have substantially larger dimensions than a haptic module comprising the actuator. Preferably, the actuator may further be used to provide force sensing at any position of the cover plate, i.e. to detect a force applied to the cover plate.

This object is solved by a device according to claim 1. Preferred embodiments are the subject of the dependent claims.

A device for generating a haptic signal is proposed, which comprises a haptic module, a base plate and a cover plate. The base plate and the cover plate are arranged parallel to one another, the cover plate having an abutment surface facing towards the base plate and a top side facing away from the base plate, the haptic module being arranged between the base plate and the cover plate, a first partial area of the haptic module abutting the abutment surface of the cover plate and a second partial area of the haptic module abutting the base plate. The device has a spring-loaded suspension via which the base plate and the cover plate are mechanically connected to each other. The spring-loaded suspension is designed in such a way that the abutment surface of the cover plate is moved towards the base plate when the cover plate is in a neutral position and a force is applied in the direction of the base plate on any point of the top side of the cover plate, so that a compressive force is always transmitted to the haptic module when a force is applied in the direction of the base plate on any point of the top side of the cover plate.

The suspension can thus be designed in such a way that a force on any point of the cover plate in the direction of the base plate always results in a compressive force exerted by the abutment surface on the haptic module. Conversely, vibration of the haptic module can result in a force being applied to the abutment surface that is transmitted to any point on the cover plate. Thus, the suspension can ensure that a haptic signal is generated at every point on the cover plate, with a haptic signal being generated in particular on remote peripheral areas of a large-area cover plate. Conversely, the suspension can also ensure that actuation of the cover plate by a user at any point on the cover plate, even at a remote edge point of a large-surface cover plate, always results in a compressive force exerted by the abutment surface on the haptic module.

The device may allow a haptic signal to be generated at any position on the cover plate, since a compressive force is always transmitted to the haptic module when a force is applied in the direction of the base plate to any point on the top side of the cover plate. Accordingly, a vibration from the single actuator can be transmitted to any position on the cover plate, including the peripheral areas.

The spring-loaded suspension comprises a first spring element that allows movement of the cover plate relative to the base plate. Further, the spring-loaded suspension comprises a guide element that prevents movement of the cover plate from the neutral position in a direction away from the base plate or that impedes movement of the cover plate from the neutral position in a direction away from the base plate relative to movement of the cover plate from the neutral position towards the base plate.

The first spring element thus allows the two plates to move relative to each other. The guide element can in turn restrict the movement of the two plates relative to each other and the guide element can guide a movement of the cover plate in such a way as to prevent tilting of the cover plate. The guide element can, for example, be a stop against which the cover plate rests when at rest and which prevents movement of the cover plate away from the base plate. Alternatively, the guide element may be a second spring element that differs in stiffness from the first spring element. For example, the second spring element may ensure that the spring-loaded suspension has a higher resistance to tensile forces than to compressive forces.

Compared to suspensions that have a first spring element but no guide element, the guide element can have the effect that a movement of the cover plate takes place in a more controlled manner and that a tilting of the cover plate is also avoided when the cover plate is actuated in a peripheral area. A suspension that has a guide element in addition to a first spring element can make it possible to combine a single haptic module with a larger dimensioned cover plate than would be possible with a suspension without a guide element.

The guide element can impede or prevent movement of the cover plate away from the base plate, ensuring that forces exerted on the cover plate are always transmitted to the haptic module, regardless of the position at which these forces are applied. Conversely, vibrations generated by the haptic module are also transmitted to any point on the cover plate and cause vibration of that point.

The first spring element and the guide element may be structurally separate elements. Accordingly, the first spring element and the guide element are not integral.

The spring-loaded suspension may comprise a plurality of first spring elements and a plurality of guide elements.

The abutment surface may be configured to transmit a force acting on the cover plate to the haptic module. The abutment surface can thereby actuate the haptic module. A vibration generated by the haptic module can be transmitted from the abutment surface to the cover plate.

The spring-loaded suspension can be designed so that the abutment surface that actuates the haptic module is always moved towards the haptic module when the cover plate is in the neutral position and a force is applied in the direction of the base plate to any point on the top side of the cover plate, regardless of the point on the top side at which the force is applied. Forces acting on the peripheral areas of the top side will thus also result in actuation of the haptic module.

The spring-loaded suspension can be designed to prevent or at least minimize tilting of the cover plate relative to the base plate. Accordingly, the cover plate moves from the neutral position substantially linearly towards the base plate when a force is applied point-wise to any point on the top side of the cover plate. Preferably, any point on the top side of the cover plate is moved towards the base plate when the cover plate is in the neutral position and a force is applied in the direction of the base plate to any point on the top side of the cover plate.

This ensures that a force applied to the cover plate is always transmitted to the haptic module, regardless of the position of the cover plate at which the force is applied. This can allow the haptic module to be used reliably as a sensor to detect a force acting on the cover plate.

In addition, the spring-loaded suspension can ensure that the haptic module can vibrate any point on the cover plate. In doing so, the spring-loaded suspension can ensure that a haptic signal is readily perceptible to a user at any point on the top side of the cover plate. When a compressive force is applied to any point on the cover plate, the cover plate is moved from the neutral position to an activated position. The spring-loaded suspension ensures that the cover plate is closer to the base plate in the activated position than in the neutral position. If the haptic module vibrates the cover plate in the activated position relative to the base plate, the cover plate will vibrate relative to the base plate in a way that can be easily felt by a user of the cover plate over the entire top side of the cover plate.

The spring-loaded suspension may be scalable over a wide range of sizes. Accordingly, the device can be manufactured in different sizes. This makes it possible to use the device for surfaces in different dimensions, for example for displays, control panels or input elements.

In particular, the haptic module can be designed to move the cover plate relative to the base plate in a direction away from or towards the base plate. This upward and downward movement of the cover plate relative to the base plate generates a haptically perceptible signal for a user. The haptic module may in particular comprise a piezoelectric actuator as the only actuator. Piezoelectric actuators are particularly suitable for generating haptic signals because they have a short response time and can be operated at different frequencies and thus can generate different haptic signals.

Furthermore, in addition to the actuator function, the piezoelectric actuator can also be operated as a sensor.

The spring-loaded suspension may form a mechanical suspension through which the base plate and the cover plate are mechanically connected. The spring-loaded suspension can exert a spring force on the cover plate that must be overcome to move the cover plate relative to the base plate.

The neutral position is a state of the device in which no force is exerted on the cover plate or base plate by the haptic module and in which no external force is exerted on the cover plate. The neutral position is a rest position of the device.

The device can be activated by applying a force to the cover plate that moves the cover plate towards the base plate. This may involve moving the cover plate from the neutral position to an activated position in which it is closer to the base plate than in the neutral position. The haptic module may be configured to exert a force on the cover plate in the activated position that causes the cover plate to vibrate.

The haptic module may have a length that is less than one-tenth of a length of the cover plate, and the haptic module may have a width that is less than one-tenth of the width of the cover plate. In this regard, the length and the width may denote expansions of the haptic module and the cover plate in directions perpendicular to a stacking direction in which the cover plate, the haptic module and the base plate are stacked. The length and the width can be perpendicular to each other. The haptic module and the cover plate may each be rectangular. Preferably, the length of the haptic module may be less than one-twentieth or less than one-fiftieth of the length of the cover plate. Preferably, the width of the haptic module may be less than one-twentieth or less than one-fiftieth of the width of the cover plate.

Accordingly, the haptic module can be significantly smaller than the cover plate. Due to the suspension comprising the guide element in addition to the first spring element, a single haptic module comprising a single actuator may be sufficient to generate a haptically perceptible signal at any position of the substantially larger cover plate and to detect actuation of the cover plate at any position.

In one embodiment, the spring-loaded suspension may comprise a counter bearing with a stop against which the cover plate rests in the neutral position. The stop may form the guide element.

The abutment of the cover plate against the stop can prevent movement of the cover plate from the neutral position. It is therefore not possible to move the cover plate away from the base plate. Only a movement of the cover plate towards the base plate is possible from the neutral position in this embodiment. In this case, the counter bearing prevents tilting, in which, for example, peripheral areas of the cover plate are moved away from the base plate. In one embodiment, the counter bearing ensures that the abutment surface, which is in contact with the haptic module, moves towards the haptic module.

The base plate may have the stop of the spring-loaded suspension that is parallel to a top side of the cover plate and abuts the stop in the neutral position. The counter bearing with the stop can restrict movement of the cover plate relative to the base plate, ensuring that each point of the cover plate is always moved towards the base plate when a force is applied to the cover plate.

The base plate may have a guide rail that engages the cover plate and is configured to guide movement of the cover plate. For example, the guide rail may only allow purely linear movements of the cover plate. The guide rail can allow a movement of the cover plate to be guided even when the cover plate has left the neutral position.

In one embodiment, the spring-loaded suspension further comprises a second spring element that exerts a spring force on the cover plate that is only to be overcome when the cover plate moves away from the base plate. The second spring element may form the guide element.

Accordingly, a higher force must be applied for a movement of the base plate away from the cover plate than for a movement of the cover plate towards the base plate. The first spring element exerts a spring force that acts on the cover plate both in the direction of tension and in the direction of compression. The second spring element exerts a spring force that only acts against the pulling direction. In the embodiment example with the two different spring elements, the movement of the cover plate away from the base plate is thus more difficult than a movement of the cover plate towards the base plate. The combination of the two different spring elements has the effect of guiding a movement of the cover plate towards the base plate and minimising a tilting of the cover plate against the base plate.

The device may have a plurality of spring elements of the first spring element type and a plurality of spring elements of the second spring element type.

A stiffness of the second spring element may be higher than a stiffness of the first spring element. The spring-loaded suspension may have a higher stiffness against movements of the cover plate away from the base plate than against movements of the cover plate towards the base plate. The spring-loaded suspension thus has a direction-dependent system stiffness.

The first and second spring elements can be any spring elements. For example, the spring elements may be Z-shaped. Alternatively, the spring elements may be a spring washer, a coil spring, a leaf spring, a flat spring or a snap-plate spring. The spring elements may comprise or be made of a flexible material, for example a rubber, an elastomer or a foam.

The device may comprise a single haptic module for generating a vibration, which is located centrally between the base plate and the cover plate. Since when a force is applied to any point on the cover plate, each point on the cover plate is moved towards the base plate, the force is transmitted to the haptic module in any case. Therefore, the arrangement of a single centrally located haptic module is sufficient. Compared to devices that have several haptic modules, a simpler and space-saving device can thus be constructed.

The haptic module may comprise a piezoelectric actuator having a top side and a bottom side, a first mechanical amplification element and a second mechanical amplification element. The first mechanical amplification element is disposed on a top side of the actuator and has the first partial area. The second mechanical amplification element is arranged on the bottom side of the actuator and comprises the second partial area. The first mechanical amplification element and the second mechanical amplification element are configured and arranged such that a change in length of the piezoelectric actuator in a direction parallel to the top side converts a movement of the first partial area perpendicular to the top side and a movement of the second partial area in a direction opposite to the direction in which the first partial area moves. The first partial area may be in contact with an inner side of the cover plate facing the base plate. The second partial area can be in contact with an inner side of the base plate facing the cover plate.

The piezoelectric actuator may comprise a piezoelectric ceramic or a piezoelectric polymer. The piezoelectric actuator may have alternating stacked inner electrodes and layers of a piezoelectric material arranged parallel to the top side of the actuator.

The first mechanical amplification element and the second mechanical amplification element may be frustoconical and cymbal-shaped, respectively. This shape is well suited for converting changes in length of the actuator into a direction perpendicular thereto, whereby the amplitude of the movement can be increased.

The device can have evaluation electronics connected to the haptic module, the evaluation electronics being designed to detect when a force exerted on the cover plate exceeds a predefined force threshold by measuring an electrical voltage generated by the haptic module. The exceeding of the force threshold and its detection can be referred to as "force sensing". The evaluation electronics can interpret the exceeding of the force threshold as actuation of the cover plate and in this case cause the haptic module to generate a vibration.

The cover plate can be designed to detect a position of a contact of the cover plate, whereby the evaluation electronics is designed to take into account a position-dependent correction factor in the detection of the exerted force. Alternatively, the cover plate can be firmly connected to a touch-sensitive surface which is designed to detect a position of contact with the touch-sensitive surface, the evaluation electronics being designed to take a position-dependent correction factor into account when detecting the force exerted. In both cases, the position-dependent correction factor can compensate for the fact that forces exerted on different positions of the cover plate are not transmitted to the haptic module to the same extent. For example, a force applied centrally on the cover plate could be transmitted more strongly to the haptic module than a force applied at a peripheral area.

In one embodiment, the force threshold stored in the evaluation electronics can be variable.

A stiffness of the spring-loaded suspension against a movement of the cover plate towards the base plate can be smaller than a stiffness of the haptic module. Alternatively or additionally, a stiffness of the spring-loaded suspension against a movement of the cover plate away from the base plate can be greater than or equal to a stiffness of the haptic module. This facilitates movement of the cover plate towards the base plate.

The spring elements of the spring-loaded suspension may be interchangeable. The cover plate may be a screen, a control panel or an input element. Alternatively, the device may have a connecting element via which the cover plate is firmly connected to a screen, a control panel or an input element.

The device may be configured to generate the haptic signal by applying an electrical voltage to the haptic module that causes the first partial area to move towards or away from the second partial area so that the cover plate and the base plate are moved towards or away from each other.

The spring-loaded suspension may comprise at least four spring elements arranged close to the corners of the cover plate and the base plate. This arrangement may guide movement of the cover plate in a desired manner.

Preferred aspects are mentioned below. For ease of reference, the aspects are numbered:
1. A device for generating a haptic signal, comprising
    a component for generating a vibration,
    a base plate and a cover plate arranged parallel to each other, the cover plate having an abutment surface facing towards the base plate and a top side facing away from the base plate,
  the component being arranged between the base plate and the cover plate, a first partial area of the component abutting the abutment surface of the cover plate and a second partial area of the component abutting the base plate, and
    a spring-loaded connection by which the base plate and the cover plate are mechanically connected to each other, wherein the spring-loaded connection is configured to move the abutment surface towards the base plate when the cover plate is in a neutral position and a force is applied towards the base plate at any point on the top side of the cover plate.
2. Device according to the previous aspect,
    wherein the spring-loaded connection comprises a counter bearing having a stop against which the cover plate abuts in the neutral position.

3. Device according to the preceding aspect,
wherein the base plate forms the stop of the spring-loaded connection.
4. Device according to the preceding aspect,
wherein the cover plate has a projection that is parallel to the top side of the cover plate,
and
wherein the projection abuts the stop in the neutral position.
5. Device according to any one of the preceding aspects,
wherein the base plate comprises a guide rail in which the cover plate engages and which is configured to guide movement of the cover plate.
6. Device according to any one of the preceding aspects,
wherein the spring-loaded connection is configured to prevent movement of the cover plate from the neutral position in a direction away from the base plate.
7. Device according to any one of aspects 1 to 5,
wherein the spring-loaded connection is configured to impede movement of the cover plate from the neutral position in a direction away from the base plate relative to movement of the cover plate from the neutral position towards the base plate.
8. Device according to any one of the preceding aspects,
wherein the spring-loaded connection comprises at least a first spring element exerting a spring force on the cover plate to be overcome upon movement of the cover plate towards the base plate and upon movement of the cover plate away from the base plate, and at least one second spring element which exerts a spring force on the cover plate which is to be overcome only during a movement of the cover plate away from the base plate,
9. Device according to the preceding aspect,
wherein a stiffness of the second spring element is higher than a stiffness of the first spring element.
10. Device according to any one of the preceding aspects,
wherein the spring-loaded connection has a higher stiffness to movements of the cover plate away from the base plate than to movements of the cover plate towards the base plate.
11. Device according to any one of the preceding aspects,
wherein the device comprises a single vibration generating member and the vibration generating member is centrally located between the base plate and the cover plate.
12. Device according to any one of the preceding aspects,
wherein the vibration generating member comprises a piezoelectric actuator having a top side and a bottom side, a first mechanical amplification element disposed on the top side of the piezoelectric actuator and having the first partial area, and a second mechanical amplification element disposed on the bottom side of the piezoelectric actuator and having the second partial area,
wherein the first mechanical amplification element and the second mechanical amplification element are configured and arranged such that a change in length of the piezoelectric actuator in a direction parallel to the top side of the piezoelectric actuator is converted into a movement of the first partial area perpendicular to the top side of the piezoelectric actuator and a movement of the second partial area in a direction opposite to the direction in which the first partial area moves.
13. Device according to the previous aspect,
wherein the piezoelectric actuator comprises a piezoelectric ceramic or a piezoelectric polymer.
14. Device according to any one of aspects 12 or 13,
wherein the first mechanical amplification element and the second mechanical amplification element are frustoconical.
15. Device according to any one of the preceding aspects,
wherein the device comprises evaluation electronics connected to the component, and wherein the evaluation electronics are configured to detect when a force applied to the cover plate exceeds a predefined force threshold by measuring an electrical voltage generated across the component.
16. Device according to the previous aspect,
wherein the cover plate is configured to detect a position of a contact of the cover plate, wherein the evaluation electronics is configured to take into account a position-dependent correction factor in the detection of the exerted force,
or
wherein the cover plate is fixedly connected to a touch-sensitive surface which is designed to detect a position of the touch of the touch-sensitive surface, wherein the evaluation electronics is designed to take into account a position-dependent correction factor in the detection of the force exerted.
17. Device according to any of the preceding aspects,
wherein a stiffness of the spring-loaded connection against a movement of the cover plate towards the base plate is less than a stiffness of the component,
and/or
wherein a stiffness of the spring-loaded connection against movement of the cover plate away from the base plate is greater than or equal to a stiffness of the component.
18. Device according to any one of the preceding aspects,
wherein the cover plate is a screen, a control panel or an input element,
or
wherein the device comprises a connecting element by which the cover plate is fixedly connected to a display screen, a control panel or an input element.
19. Device according to any one of the preceding aspects,
wherein the device is configured to generate the haptic signal by applying an electrical voltage to the component which causes the first partial area to move towards or away from the second partial area such that the cover plate and the base plate are moved towards or away from each other.
20. Device according to any one of the preceding aspects,
wherein the spring-loaded connection comprises at least four spring elements arranged close to corners of the base plate and the cover plate.

In the following, preferred embodiments of the invention will be explained with reference to the figures.

FIG. 1 shows a haptic module 100 for generating a vibration in perspective view.

FIG. 2 shows a cross-section through the haptic module 100.

Figure 1:
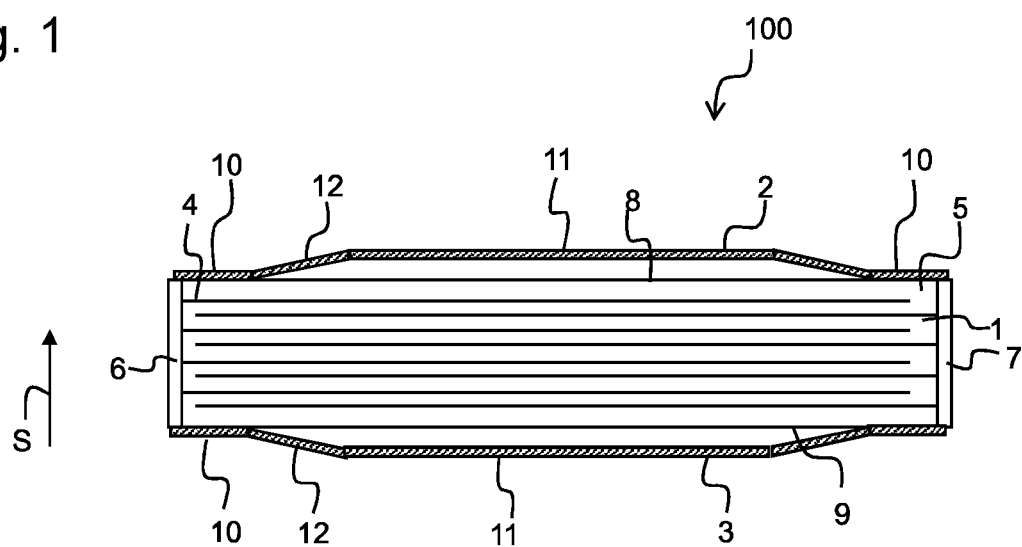
FIG. 1 shows a haptic module for generating a vibration in perspective view.

The haptic module 100 has a piezoelectric actuator 1, a first mechanical amplification element 2 and a second mechanical amplification element 3. The haptic module 100 can be used in particular in a device for generating a haptic signal and for detecting operating signals.

The piezoelectric actuator 1 has a stack of inner electrodes 4 and piezoelectric layers 5 alternately stacked one on top of the other in a stacking direction S. The piezoelectric actuator 1 has a first external electrode 6 and a second external electrode 7. The inner electrodes 4 are alternately contacted in stacking direction S with the first external electrode 6 or with the second external electrode 7. The piezoelectric actuator 1 is cuboid-shaped. A height indicates the extension of the piezoelectric actuator 1 in stacking direction S. The height of the piezoelectric actuator 1 is smaller than its width and length. The width and the length indicate the extension of the actuator 1 in directions perpendicular to the stacking direction S. A top side 8 and a bottom side 9 of the piezoelectric actuator 1 are opposite to each other in stacking direction S.

The piezoelectric layers 5 may comprise a piezoelectric ceramic, in particular a lead zirconate titanate ceramic (PZT ceramic). The PZT ceramic may additionally contain Nd and Ni. Alternatively, the PZT ceramic may additionally comprise Nd, K and optionally Cu. Alternatively, the piezoelectric layers 5 may have a composition comprising $$Pb(Zr_xTi_{1-x})O_3 + yPb(Mn_{1/3}Nb_{2/3})O_3.$$

Alternatively, the piezoelectric layers 5 may comprise a piezoelectric polymer.

The inner electrodes 4 comprise copper or are made of copper.

The piezoelectric actuator 1 is configured such that when an electrical voltage is applied, a deformation of the piezoelectric actuator 1 occurs. In particular, the piezoelectric layers 5 are polarised such that the application of an electrical voltage between the inner electrodes 4 leads to a change in the extension of the piezoelectric actuator 1 perpendicular to the stacking direction S.

To further enhance the effect of the change in length, the device has the two amplifying elements 2, 3. The first amplifying element 2 is fixed on the top side 8 of the piezoelectric actuator 1. The second amplifying element 3 is fixed on the bottom side 9 of the piezoelectric actuator 1. The two amplifying elements 2, 3 are identical in construction.

The first amplifying element 2 and the second amplifying element 3 are frustoconical. The first amplifying element 2 and the second amplifying element 3 each have a peripheral area 10 which is in direct contact with the piezoelectric actuator 1. The first amplifying element 2 and the second amplifying element 3 each have a partial area 11 which is spaced apart from the piezoelectric actuator 1. The partial areas 11 are parallel to the top side 8 and the bottom side 9 of the piezoelectric actuator 1, respectively.

The first reinforcing element 2 and the second reinforcing element 3 each have a connecting area 12, the partial area 11 being connected to the peripheral area 10 via the connecting area 12. The peripheral area 10 encloses the partial area 11 in a circular or elliptical shape. The connecting area 12 encloses an angle α with 0<α<90° to the top side 8 or bottom side 9 of the piezoelectric actuator 1.

The amplifying elements 2, 3 are dimensioned and connected to the piezoelectric actuator 1 in such a way that the respective partial area 11 of the amplifying elements 2, 3 executes a stroke movement in the stacking direction S as a result of a change in the extension of the actuator 1 in a direction perpendicular to the stacking direction S, the amplitude of the stroke movement being greater than the amplitude of the change in length of the actuator 1.

The reinforcing elements 2, 3 can be metal sheets. The reinforcing elements 2, 3 may comprise titanium or be made of titanium. The peripheral areas 10 of the amplifying elements 2, 3 are non-detachably connected to the piezoelectric actuator 1. For example, the peripheral areas 10 may be connected to the actuator 1 by an adhesive bond.

Figure 2:
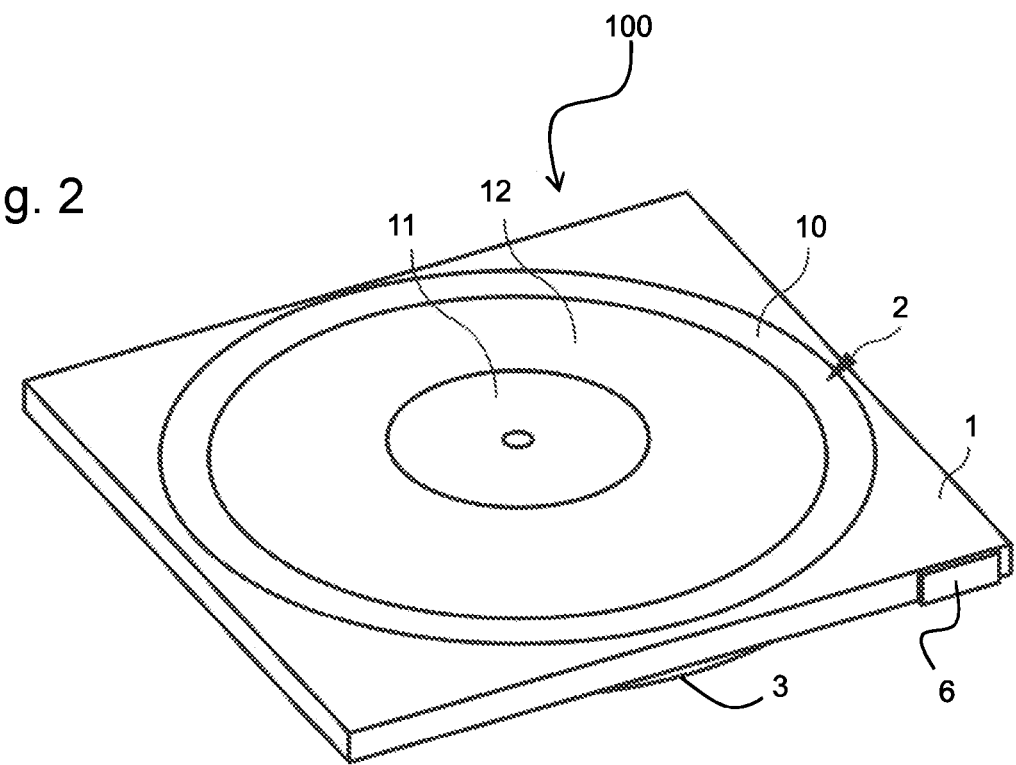
FIG. 2 shows a cross-section through the haptic module.
Figure 3:
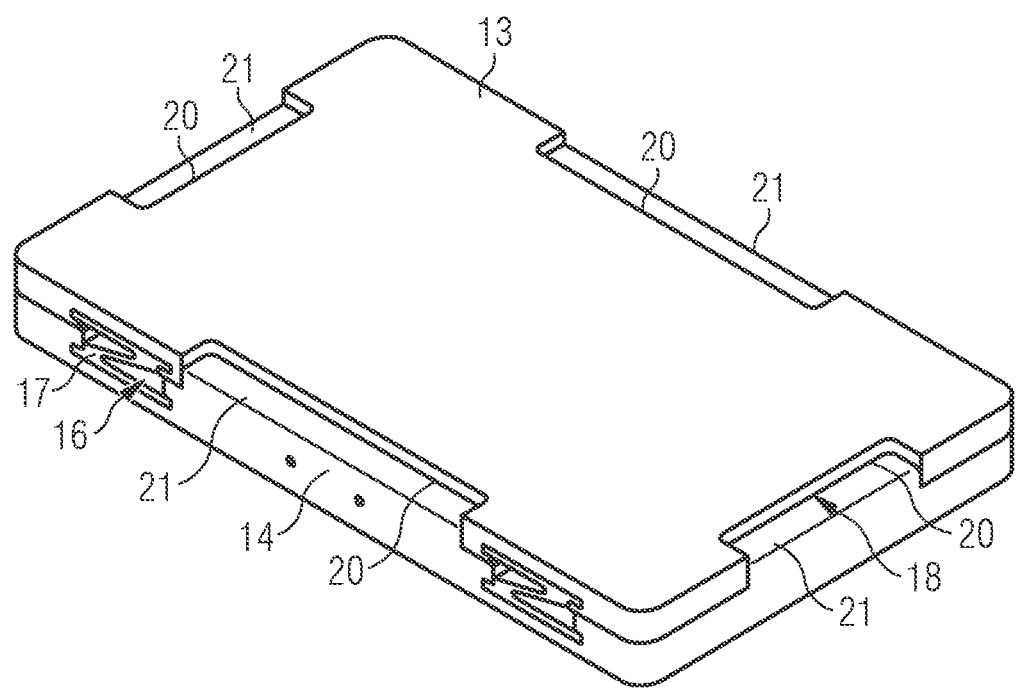
FIGS. 3 to 6 show a device for generating a haptic signal according to a first embodiment.
Figure 4:
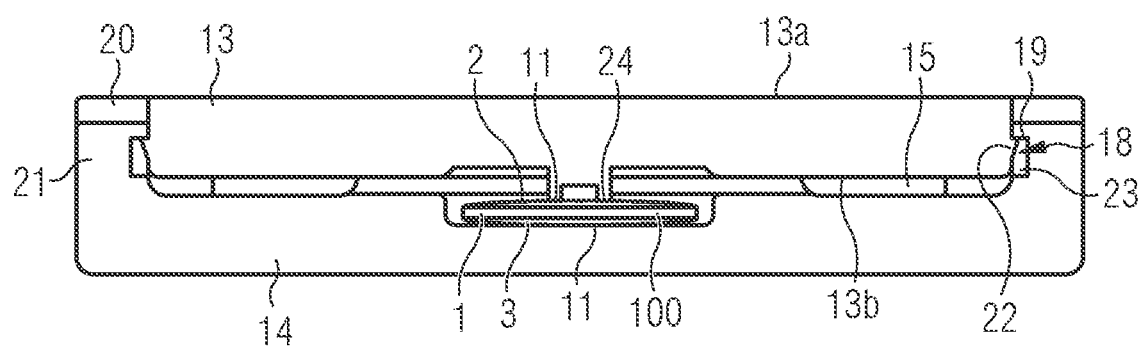
Figure 5:
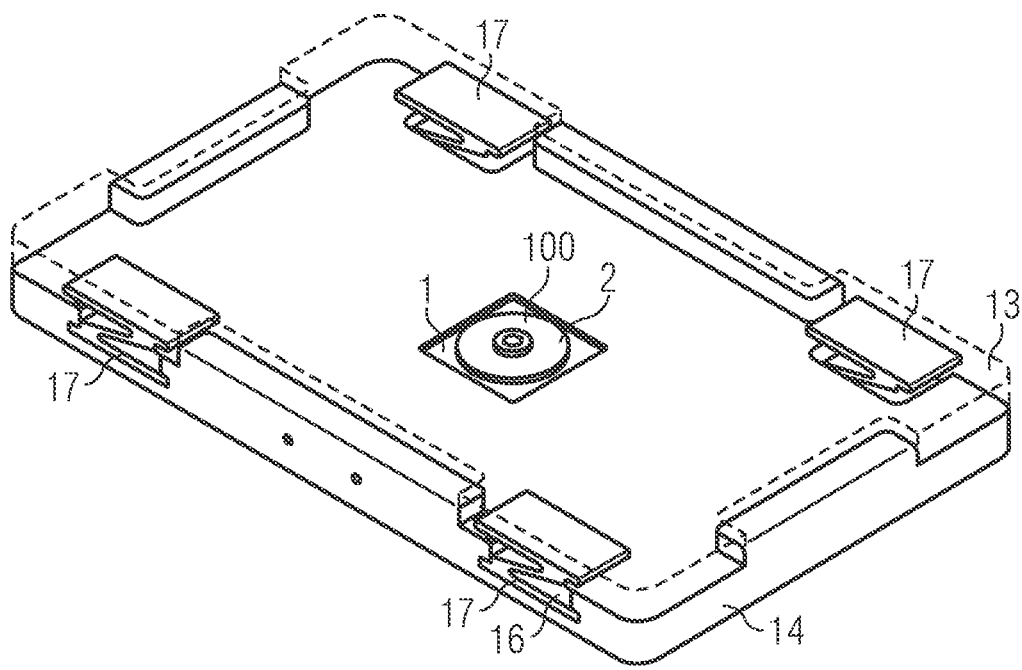
Figure 6:
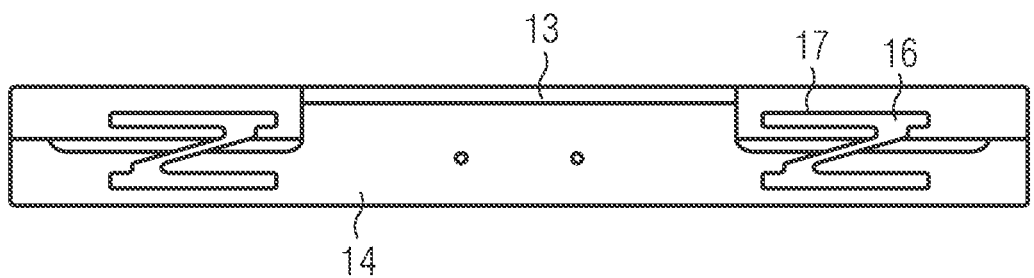

FIGS. 3 to 6 show a device for generating a haptic signal comprising the haptic module 100 shown in FIGS. 1 and 2. FIG. 3 shows a perspective view of the device. FIG. 4 shows a cross-section of the device. FIG. 5 shows a perspective view of the device with a cover plate 13 of the device shown transparent. FIG. 6 shows a side view of the device.

The device has a base plate 14 and a cover plate 13. The base plate 14 and the cover plate 13 are arranged parallel to each other. The piezoelectric actuator 1 and the two amplifying elements 2, 3 are arranged between the base plate 14 and the cover plate 13. The partial area 11 of the first mechanical amplification element 2 is adjacent to a side of the cover plate 13 facing the piezoelectric actuator 1. The partial area 11 of the second mechanical amplification element 3 is located on a side of the base plate 14 facing the piezoelectric actuator 1.

An air gap 15 is formed between the cover plate 13 and the base plate 14, allowing the cover plate 13 to be moved towards the base plate 14. The cover plate 13 and the base plate 14 are mechanically connected to each other via a spring-loaded suspension 16.

In the figures, the device is shown in the neutral position. In the neutral position, no voltage is applied to the piezoelectric actuator 1 and no force is exerted on the cover plate 13. The neutral position is therefore a rest position of the device. The spring-loaded suspension 16 between the base plate 14 and the cover plate 13 is designed in such a way that the cover plate 13 cannot be moved away from the piezoelectric actuator 1 from the neutral position. It is only possible to move the cover plate 13 towards the piezoelectric actuator 1.

In the first embodiment example, the spring-loaded suspension 16 comprises four Z-shaped first spring elements 17. Each of the spring elements 17 is connected to both the base plate 14 and the cover plate 13. The spring elements 17 are designed to exert a spring force on the cover plate 13, which must be overcome to move the cover plate 13 towards the base plate 14 and to move the cover plate 13 away from the base plate 14.

The spring elements 17 are symmetrically arranged in the device. Each spring element 17 is arranged near a corner of the base plate 14 and the cover plate 13. Each spring element 17 is arranged at a longitudinal edge of the base plate 14 and at a longitudinal edge of the cover plate 13.

The spring elements 17 are arranged and a stiffness of the spring elements 17 is selected such that the cover plate 13 moves substantially linearly towards the base plate 14 when a force is applied to any position on the cover plate 13 by a user. The spring elements 17 cause a force applied to the cover plate 13 to tilt the cover plate 13 relative to the base plate 14 only to a very small extent.

A stiffness of the spring-loaded suspension 16 against a movement of the cover plate 13 towards the base plate 14 can be smaller than the stiffness of the haptic module 100. The stiffness of the spring-loaded suspension 16 against a movement of the cover plate 13 away from the base plate 14 can be greater than or equal to the stiffness of the haptic module 100. This choice of stiffnesses can facilitate movement of the cover plate 13 towards the base plate 14.

The spring-loaded suspension 16 between the cover plate 13 and the base plate 14 comprises a counter bearing 18. The counter bearing 18 has a stop 19 against which the cover plate 13 rests in the neutral position and which prevents movement of the cover plate 13 away from the base plate 14. Accordingly, in this embodiment example, the stop 19 may form a guide element that prevents movement of the cover plate 13 from the neutral position in a direction away from the base plate 14.

The cover plate 13 is a rectangular plate. The cover plate has a top side 13a facing away from the base plate. The top side 13a of the cover plate 13 is adapted to be actuated by a user, for example by the user pressing on the top side 13a with a stylus or a finger. Furthermore, the top side 13a is designed to transmit a haptically perceptible signal to the user by means of a vibration. The cover plate 13 has a bottom side 13b facing the base plate 14. An abutment surface 24 is formed on the bottom side 13b of the cover plate, which abuts against the partial area 11 of the first reinforcing element. The abutment surface is configured to transmit a vibration of the haptic module to the cover plate 13 and to transmit a force acting on the cover plate 13 to the haptic module.

The cover plate 13 has a recessed area 20 at each of its edges, in which a raised section 21 of the base plate engages.

The cover plate 13 has projections 22. The projections 22 project inwardly. The projections 22 are arranged in a guide rail 23 formed in the base plate 14. In the neutral position, the projections 22 rest against the stop 19 formed in the base plate 14 and prevent movement of the cover plate 13 away from the base plate 14. The stop 19 forms a termination of the guide rail 23 in a direction facing the cover plate.

The base plate 14 is a rectangular plate. The base plate 14 has the same width and the same length as the cover plate 13. The base plate 14 is arranged parallel to the cover plate 13.

Raised sections 21 are formed on the edges of the base plate 14 and protrude towards the cover plate 13. The raised sections 21 are arranged between the spring elements 17 of the spring-loaded suspension 16. The raised sections 21 each form a guide rail 23 on their inner sides, in which the projections 22 of the cover plate 13 are arranged. The projections 22 of the cover plate 13 are guided along the guide rail 23 when the cover plate 13 is moved towards the base plate 14.

The base plate 14 has a surface which forms the stop 19 of the spring-loaded suspension 16. The projections 22 of the cover plate 13 rest against the stop 19 of the base plate 14 in the neutral position.

If a user now applies a force to the cover plate 13, for example by pressing on the cover plate 13 with his finger or a pin at any position of the cover plate 13, the cover plate 13 is moved towards the base plate 14. In particular, the abutment surface 24 of the cover plate 13 is moved towards the base plate 13 and the piezoelectric actuator 1. The spring-loaded suspension 16, in suspension with the counter bearing, ensures that tilting of the cover plate 13 relative to the base plate 14 is kept to a minimum and that the cover plate 13 moves essentially linearly. The movement of the cover plate 14 towards the base plate 13 deforms the first mechanical amplification element 2 and the second mechanical amplification element 3, in particular the partial areas 11 are moved towards each other. As a result, the mechanical amplification elements 2, 3 exert a force on the piezoelectric actuator 1, by which the piezoelectric actuator 1 is pulled lengthwise and widthwise. Due to the piezoelectric effect, a voltage signal is now generated in the piezoelectric actuator 1, which can be read out by an electronic evaluation unit connected to the piezoelectric actuator 1.

If the voltage signal exceeds a predefined force threshold, this is interpreted as actuation of the cover plate 13. In this case, an electrical voltage can be applied to the piezoelectric actuator 1, which causes the actuator 1 to vibrate. This causes the partial areas 11 of the reinforcing elements 2, 3 to move relative to each other in the stacking direction S and the cover plate 13 is moved relative to the base plate 14. The movement of the cover plate 13 can be perceived as a haptic signal by a user of the device.

The design and arrangement of the spring-loaded suspension 16 allows the device to have only one piezoelectric actuator 1, which is arranged centrally between the base plate 14 and the cover plate 13. Regardless of the position of the cover plate 13 at which a force is applied to the cover plate 13, the force always causes the abutment surface 24 of the cover plate 13 to move towards the base plate 14, thereby exerting a force on the piezoelectric actuator 1. The piezoelectric actuator 1 can detect that a force is being applied to the cover plate 13, regardless of the position of the cover plate 13 at which the force is applied. The spring-loaded suspension 16 is configured such that a vibration of the haptic module 100, moves the cover plate 13 to produce a haptically perceptible signal at each position of the cover plate 13.

The piezoelectric actuator 1 can be connected to the evaluation electronics. The evaluation electronics measures the electrical voltage generated in the actuator 1 and detects an actuation of the cover plate 13 when the voltage exceeds a predefined force threshold (force sensing).

The cover plate 13 can be designed to detect at which position the cover plate 13 is touched. This information can be passed on to the evaluation electronics, whereby the evaluation electronics take a position-dependent correction factor into account in order to determine whether the predetermined threshold value is exceeded. Accordingly, the threshold value can be defined differently for different areas of the cover plate 13 depending on the position.

The cover plate 13 may alternatively be connected to a touch-sensitive surface that is touched by a user. In this case, information about the position at which the touch-sensitive surface is touched can be passed on to the evaluation electronics so that the latter can in turn take the position-dependent correction factor into account.

Figure 7:
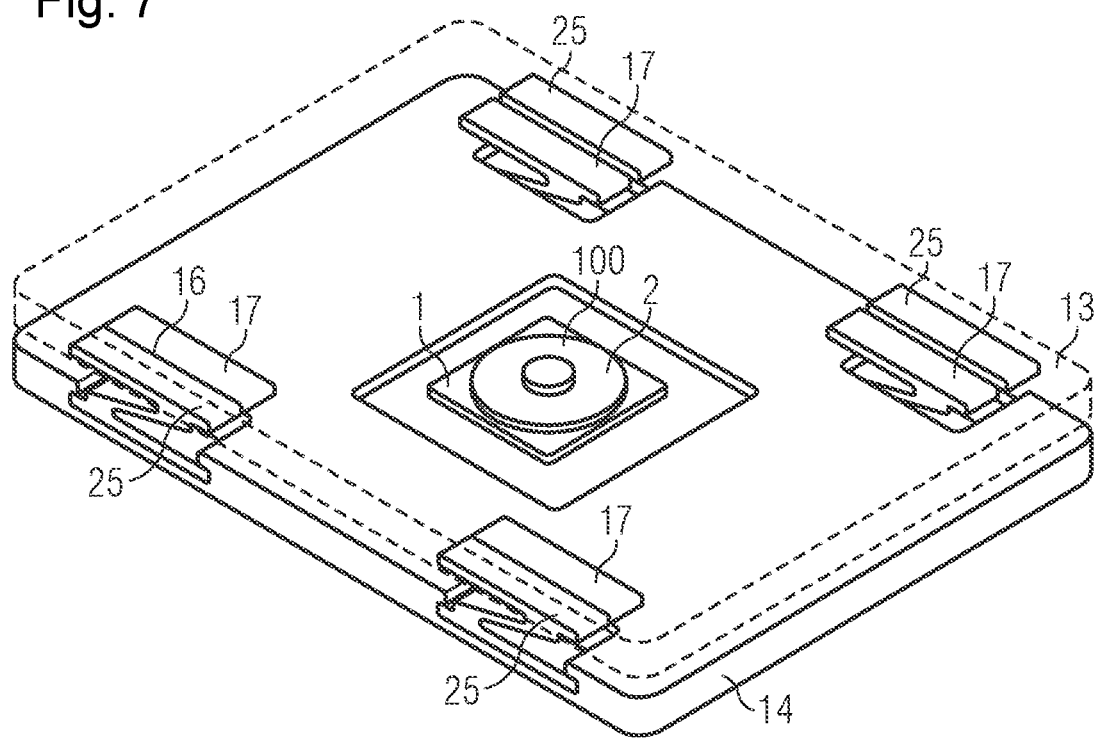
FIGS. 7 to 8 show a device for generating a haptic signal according to a second embodiment.
Figure 8:
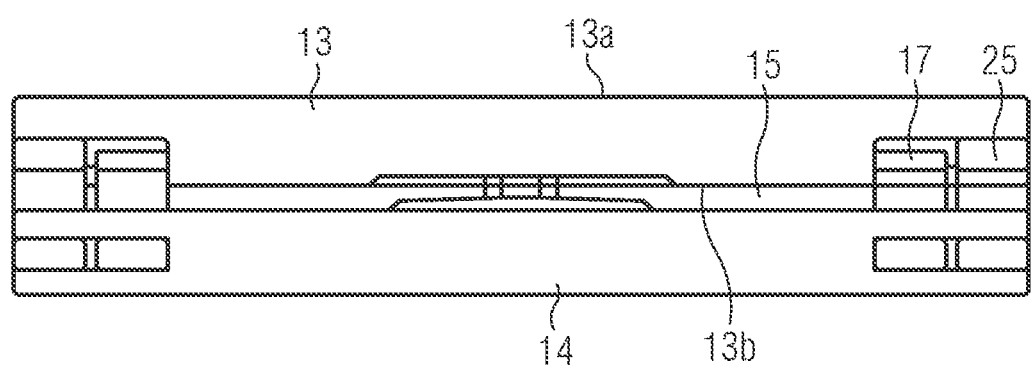

FIGS. 7 and 8 show a second embodiment of the device. FIG. 7 shows a perspective view of the device, whereby the cover plate 13 is shown transparent. FIG. 8 shows a cross-section through the device according to the second embodiment.

In contrast to the device according to the first embodiment, the device according to the second embodiment does not have a counter bearing. Instead, the device according to the second embodiment comprises first spring elements 17 and second spring elements 25. The first spring elements 17 and the second spring elements 25 are each connected to both the cover plate 13 and the base plate 14. The first spring elements 17 and the second spring elements 25 are Z-shaped.

The second spring elements 25 assume the function of the counter bearing. In this embodiment example, the second spring elements 25 form a guide element that impedes a movement of the cover plate 13 out of the neutral position in a direction away from the base plate 14 compared to a movement of the cover plate 13 out of the neutral position towards the base plate 14.

The second spring elements 25 exert a spring force on the cover plate 13 that only needs to be overcome when the cover plate 13 moves away from the base plate 14. The second spring elements 25 do not impede the cover plate 13 from moving towards the base plate 14. The first spring elements are identical in construction to the spring elements of the first embodiment. The first spring elements exert a spring force both against movements of the cover plate towards the base plate and against movements of the cover plate away from the base plate.

The spring-loaded suspension with the first and second spring elements ensures that the cover plate is moved substantially linearly towards the base plate, regardless of the position at which a force acts on the cover plate. Further, the second spring elements are designed to limit movement of the cover plate away from the base plate from the neutral position. The second spring elements have a higher stiffness than the first spring elements. The spring-loaded suspension thus has a directional system stiffness.

LIST OF REFERENCE SIGNS 1 piezoelectric actuator
2 first mechanical amplification element
3 second mechanical amplification element
4 inner electrode
5 piezoelectric layer
6 external electrode
7 external electrode
8 Top side of the piezoelectric actuator
9 Bottom side of the piezoelectric actuator
10 Peripheral area
11 Partial area
12 Connecting area
13 Cover plate
13a Top side of cover plate
13b Bottom side of cover plate
14 Base plate
15 Air gap
16 Spring-loaded connection
17 (first) spring element
18 counter bearing
19 stop
20 recessed area of cover plate
21 Raised section of base plate
22 Projection
23 Guide rail
24 abutment surface
25 (second) spring element
100 Haptic module
S Stacking direction

The invention claimed is:

1. Device for generating a haptic signal, comprising
a single haptic module comprising a single actuator,
a base plate and a cover plate which are arranged parallel to one another, the cover plate having an abutment surface facing towards the base plate and a top side facing away from the base plate,
the haptic module being arranged between the base plate and the cover plate, a first partial area of the haptic module abutting the abutment surface of the cover plate and a second partial area of the haptic module abutting the base plate, and
a spring-loaded suspension via which the base plate and the cover plate are mechanically connected to one another,
wherein the spring-loaded suspension is designed such that the abutment surface is moved towards the base plate when the cover plate is in a neutral position and a force is exerted in the direction of the base plate on any point of the top side of the cover plate, so that a compressive force is always transmitted to the haptic module when a force is exerted in the direction of the base plate on any point of the top side of the cover plate,
wherein the spring-loaded suspension comprises a first spring element allowing movement of the cover plate relative to the base plate, and
wherein the spring-loaded suspension comprises a guide element preventing movement of the cover plate from the neutral position in a direction away from the base plate or
which impedes a movement of the cover plate out of the neutral position in a direction away from the base plate compared to a movement of the cover plate out of the neutral position towards the base plate,
wherein the haptic module comprises as the actuator a piezoelectric actuator having a top side and a bottom side, and wherein the haptic module further comprises
a first mechanical amplification element which is arranged on the top side of the piezoelectric actuator and which comprises the first partial area, and
a second mechanical amplification element which is arranged on the bottom side of the piezoelectric actuator and which comprises the second partial area,
wherein the first mechanical amplification element and the second mechanical amplification element are configured and arranged in such a manner that a change in length of the piezoelectric actuator in a direction parallel to the top side of the piezoelectric actuator is converted into a movement of the first partial area perpendicular to the top side of the piezoelectric actuator and a movement of the second partial area in a direction opposite to the direction in which the first partial area moves.

2. Device according to claim 1,
wherein the first spring element and the guide element are structurally separate elements.

3. Device according to claim 1,
wherein the haptic module has a length that is less than one tenth of a length of the cover plate, and the haptic module has a width that is less than one tenth of the width of the cover plate.

4. Device according to claim 1,
wherein the base plate comprises a guide rail in which the cover plate engages and which is configured to guide a movement of the cover plate.

5. Device according to claim 1,
wherein the spring-loaded suspension comprises a counter bearing with a stop against which the cover plate rests in the neutral position,
wherein the stop forms the guide element.

6. Device according to claim 4,
wherein the spring-loaded suspension comprises a counter bearing with a stop against which the cover plate rests in the neutral position,
wherein the stop forms the guide element,
wherein the stop forms a termination of the guide rail in a direction facing the cover plate.

7. Device according to claim 5,
wherein the base plate forms the stop of the spring-loaded suspension.

8. Device according to claim 5,
wherein the cover plate has a projection which is parallel to the top side of the cover plate, and
wherein the projection abuts the stop in the neutral position.

9. Device according to claim 1,
wherein the first spring element exerts a spring force on the cover plate which has to be overcome when the cover plate moves towards the base plate and when the cover plate moves away from the base plate.

10. Device according to claim 1,
wherein the device comprises as a guide element at least one second spring element which exerts a spring force on the cover plate which is to be overcome only when the cover plate moves away from the base plate.

11. Device according to claim 10,
wherein a stiffness of the second spring element is higher than a stiffness of the first spring element.

12. Device according to claim 1,
wherein the spring-loaded suspension has a higher stiffness towards movements of the cover plate away from the base plate than towards movements of the cover plate towards the base plate.

13. Device according to claim 1,
wherein the single haptic module is centrally located between the base plate and the cover plate.

14. Device according to claim 1,
wherein the piezoelectric actuator comprises a piezoelectric ceramic or a piezoelectric polymer.

15. Device according to claim 1,
wherein the first mechanical amplification element and the second mechanical amplification element are frustoconical.

16. Device according to claim 1,
wherein the device comprises evaluation electronics connected to the haptic module, and wherein the evaluation electronics are configured to detect when a force applied to the cover plate exceeds a predefined force threshold by measuring an electrical voltage generated at the haptic module.

17. Device according to claim 16,
wherein the cover plate is configured to detect a position of a contact of the cover plate, wherein the evaluation electronics is configured to take into account a position-dependent correction factor in the detection of the exerted force, or
wherein the cover plate is fixedly connected to a touch-sensitive surface which is configured to detect a position of the touch of the touch-sensitive surface, wherein the evaluation electronics is configured to take into account a position-dependent correction factor in the detection of the exerted force.

18. Device according to claim 1,
wherein a stiffness of the spring-loaded suspension against a movement of the cover plate to the base plate is smaller than a stiffness of the haptic module, and/or
wherein a stiffness of the spring-loaded suspension against a movement of the cover plate away from the base plate is greater than or equal to the stiffness of the haptic module.

19. Device according to claim 1,
wherein the cover plate is a screen, a control panel or an input element, or
wherein the device comprises a connecting element via which the cover plate is fixedly connected to a screen, a control panel or an input element.

20. Device according to claim 1,
wherein the device is configured to generate the haptic signal by applying an electrical voltage to the haptic module causing the first partial area to move towards or away from the second partial area such that the cover plate and the base plate are moved towards or away from each other.

21. Device according to claim 1,
wherein the spring-loaded suspension comprises at least four spring elements arranged close to corners of the base plate and the cover plate.

* * * * *